United States Patent [19]
Kumasaka et al.

[11] Patent Number: 5,998,909
[45] Date of Patent: Dec. 7, 1999

[54] PIEZOELECTRIC TRANSFORMER

[75] Inventors: Katsunori Kumasaka; Masafumi Katsuno; Koichi Okamoto; Yoshiaki Fuda, all of Miyagi, Japan

[73] Assignee: Tokin Corporation, Miyagi, Japan

[21] Appl. No.: 09/011,177

[22] PCT Filed: May 15, 1997

[86] PCT No.: PCT/JP97/01638

§ 371 Date: Feb. 22, 1998

§ 102(e) Date: Feb. 22, 1998

[87] PCT Pub. No.: WO97/43791

PCT Pub. Date: Nov. 20, 1997

[30] Foreign Application Priority Data

| May 15, 1996 | [JP] | Japan | 8-119945 |
| Jun. 17, 1996 | [JP] | Japan | 8-155825 |
| Jun. 17, 1996 | [JP] | Japan | 8-155827 |
| Jun. 21, 1996 | [JP] | Japan | 8-161722 |
| Jun. 24, 1996 | [JP] | Japan | 8-163426 |

[51] Int. Cl.$^6$ .................................. H01L 41/08
[52] U.S. Cl. ................... 310/348; 310/345; 310/346; 310/359; 310/356
[58] Field of Search .................. 310/344, 346, 310/348, 358, 359, 345, 356

[56] References Cited

U.S. PATENT DOCUMENTS

| 3,622,813 | 11/1971 | Kumon | 310/345 |
| 3,694,674 | 9/1972 | Inoue | 310/345 X |
| 3,754,153 | 8/1973 | Carpenter et al. | 310/346 X |
| 3,885,173 | 5/1975 | Lee | 310/345 X |
| 4,454,444 | 6/1984 | Fujiwara et al. | 310/348 X |
| 4,757,581 | 7/1988 | Yamada et al. | 310/348 X |
| 5,459,368 | 10/1995 | Onishi et al. | 310/344 X |
| 5,747,916 | 5/1998 | Sugimoto et al. | 310/348 |
| 5,825,262 | 10/1998 | Inoue et al. | 310/348 X |
| 5,847,490 | 12/1998 | Kumasaka et al. | 310/345 X |

*Primary Examiner*—Mark O. Budd

[57] ABSTRACT

A piezoelectric transformer has input and output terminal electrodes (12c, 12d, 13c, 13d) exposed on a bottom surface thereof. The terminal electrodes are mechanically and electrically connected to connection portions (15a–15d) of a flexible printed circuit (18) for connecting with an external circuit. The transformer is held between a base element (21b, 22) and a cover (21a, 23, 25) coupled to each other. The base element may be a circuit board on which the transformer should be mounted.

14 Claims, 12 Drawing Sheets

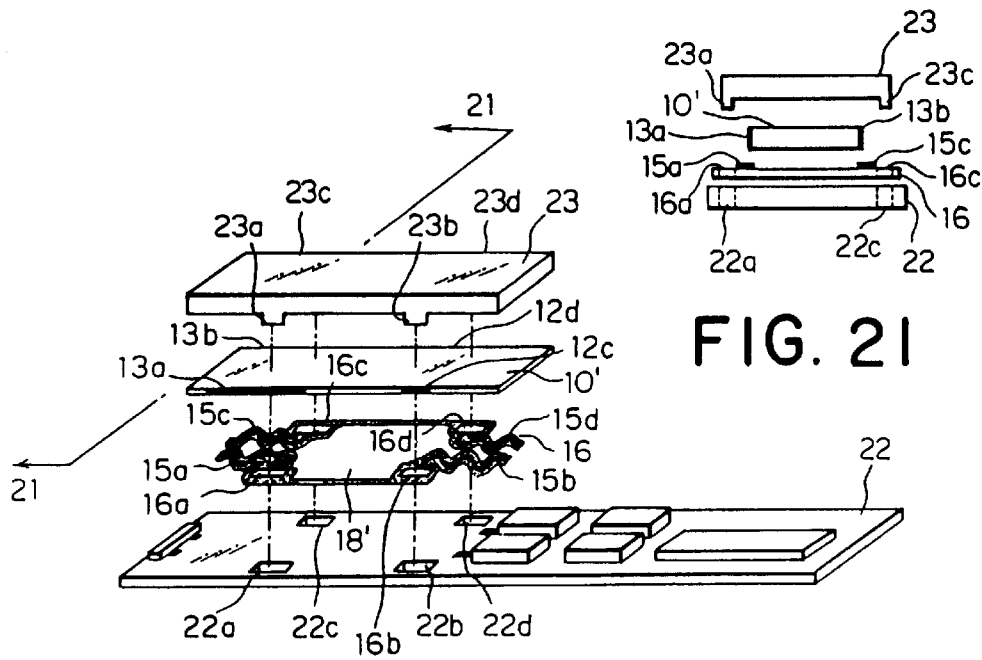
FIG. 20
FIG. 21
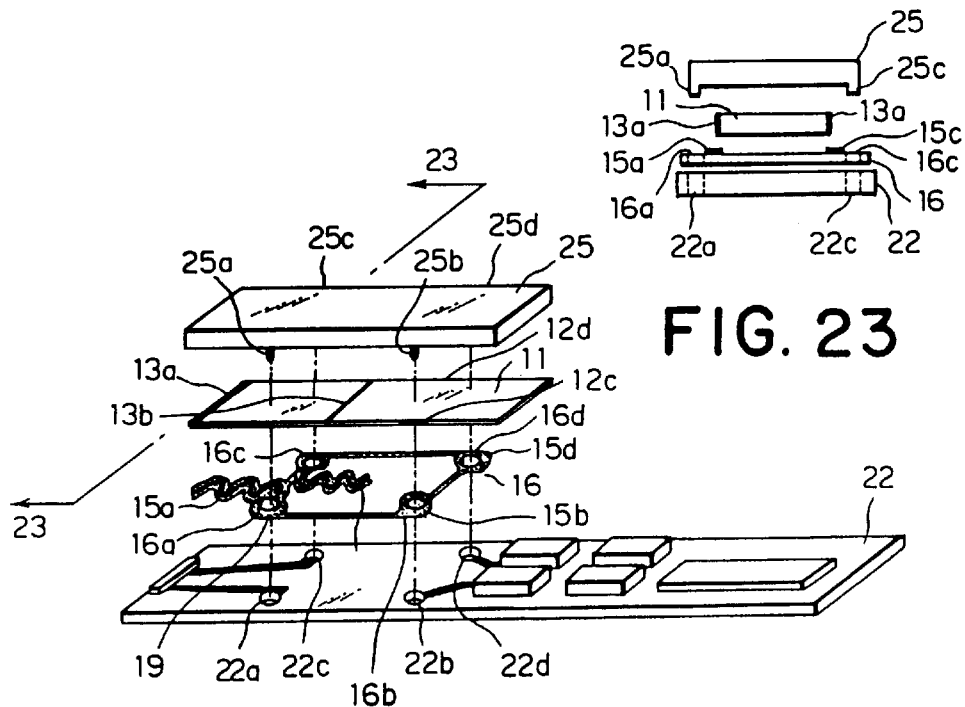
FIG. 22
FIG. 23

PIEZOELECTRIC TRANSFORMER

TECHNICAL FIELD

The present invention relates to a piezoelectric transformer.

BACKGROUND ART

As is known in the art, the piezoelectric transformer uses a piezoelectric vibrator. The piezoelectric vibrator has at least one pair of drive electrodes formed on and/or in a piezoelectric-ceramic plate. When an AC voltage is applied to the pair of drive electrodes, the plate vibrates due to the piezoelectric effect with a resonant mode such as a single wavelength resonant mode. When the plate is vibrating, variation of voltage potential is generated at any position of the plate. The variable voltage potential can be taken out from an output electrode formed on the position. A pair of output electrodes can be formed at different positions on the plate. Thus, the AC voltage applied to the drive electrodes as primary electrodes is transformed and is obtained at the output electrodes as secondary electrodes.

Since it is important for the piezoelectric transformer that the piezoelectric plate vibrates, it is a serious problem to support the transformer without suppression of the vibration. A waveform of the vibration has vibration nodes and antinodes. Therefore, the transformer is supported at positions corresponding to the vibration nodes.

On the other hand, leads are required to apply the input voltage to the primary electrodes and take out the transformed voltage from the secondary electrodes. Usually, lead wires are connected to the primary electrodes and the secondary electrodes. However, the lead connection points are not always at positions corresponding to the vibration nodes. The lead wires should be free without tension so as to interfere the vibration of the piezoelectric plate. The lead wires are troublesome for assembling, maintenance and other deal of an electrical circuit device, especially, a small-sized device.

Further, the primary and secondary electrodes are formed on different surfaces of the piezoelectric plate. Therefore, mounting and wiring operation of the transformer on a circuit board is complex. This results in large space for mounting the transformer on the circuit board and also in a high cost and large size of the circuit device.

Therefore, it is an object of the present invention to provide the piezoelectric transformer which has a simple structure of connection with an external circuit and is small sized.

DISCLOSURE OF INVENTION

The present invention provides a small-sized piezoelectric transformer with a connection lead structure mounted on one surface of the piezoelectric plate. The connection lead structure is for connecting the transformer with an external circuit with simple operation.

According to the present invention, there is provided a piezoelectric transformer comprising a transformer element and a connection lead structure coupled to the transformer element for connecting the transformer element with an external circuit. The transformer element comprises:

a rectangular plate made of a piezoelectric ceramic and having a first surface and side surfaces;

at least one pair of primary electrodes provided to the rectangular plate for receiving a driving voltage as a primary voltage to drive vibration of the rectangular plate by the piezoelectric effect;

input terminal electrodes formed on the rectangular plate partially exposed on the first surface and connected to pair of electrodes, respectively; and at least one secondary electrode formed at a region of the rectangular plate where a voltage potential is generated by the vibration of the rectangular plate due to the piezoelectric effect, the secondary electrode having an output terminal electrode portion extending to expose on the first surface of the rectangular plate.

The connection lead structure comprises:

a flexible flat sheet of insulator material; and a plurality of conductor strips formed in the flat sheet and having connection portions partially exposed out of the flat sheet, the input and output terminal electrodes being mechanically and electrically connected to a corresponding one of the connection portions in the condition that the transformer element stands on the flat sheet with the first surface of the rectangular plate overlying the flat sheet.

Other aspects, developments and modifications are described in the following description and appended claims.

BRIEF DESCRIPTION OF DRAWINGS

FIG. 20 is an exploded view of a piezoelectric transformer according to another embodiment of the present invention;

FIG. 21 is a sectional view taken along a line 21—21 in FIG. 20;

FIG. 22 is an exploded view of a piezoelectric transformer according to another embodiment of the present invention;

FIG. 23 is a sectional view taken along a line 23—23 in FIG. 22; and

BEST MODE FOR EMBODYING THE INVENTION

Prior to description of best mode for carrying out the present invention, the prior art will be described with reference to FIGS. 1 through 4 so as to facilitate the better understanding of the present invention.

Figure 1:
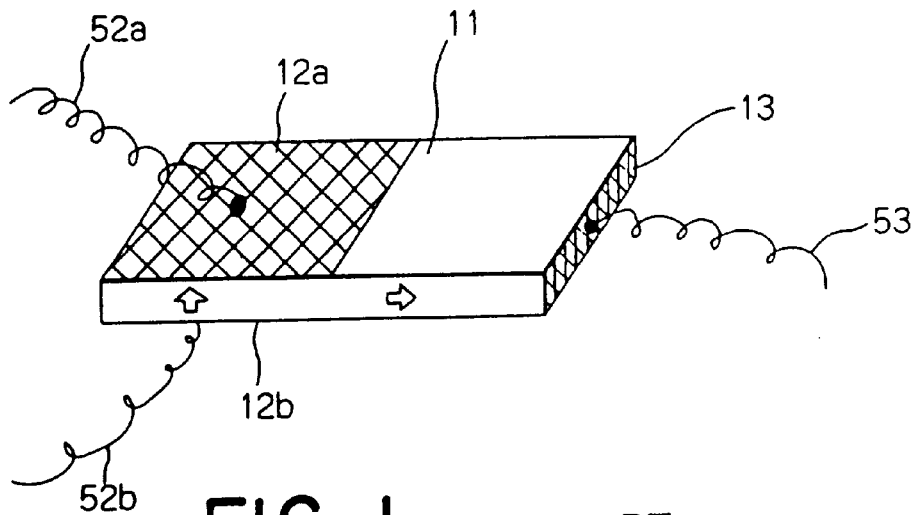
FIG. 1 is a perspective view of an example of a known piezoelectric transformer.

Referring to FIG. 1, a known piezoelectric transformer shown therein comprises a rectangular plate 11 of a piezoelectric-ceramic material, a pair of primary electrodes 12a and 12b, and a secondary electrode 13 formed on an end surface of the plate 11.

As the piezoelectric-ceramic materials used in the piezoelectric transformer, there are known ceramics of Pb(FeNb)ZrTiO$_3$ type, Pb(MnSb)ZrTiO$_3$ type, Pb(MnNb)ZrTiO$_3$ type, Pb(FeSb)ZrTiO$_3$ type, and the like.

The primary electrodes 12a and 12b are formed on the opposite surfaces of a right half portion (as viewed in the figure) of the plate 11. The half portion of the plate 11 is polarized in the thickness direction as shown by an arrow.

Figure 4:
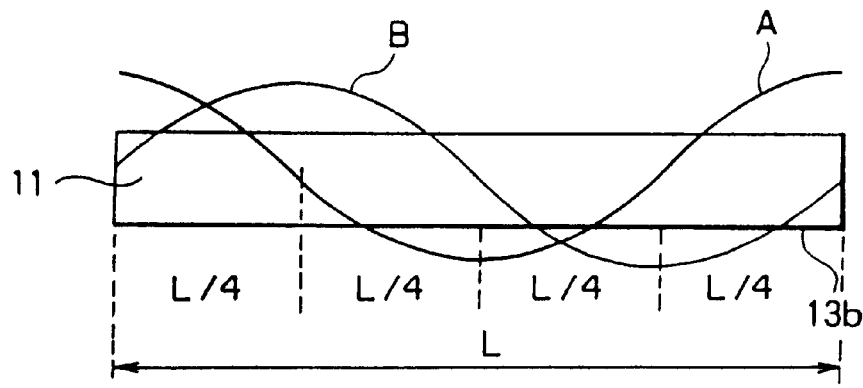
FIG. 4 is a diagrammatical view illustrating vibration of a piezoelectric plate.

The piezoelectric-ceramic rectangular plate 11 with the primary electrodes 12a and 12b is known as a piezoelectric vibrating element. In detail, when an AC voltage is applied across the pair of primary electrodes 12a and 12b, the plate 11 vibrates with a wavelength equal to the length L of the plate 11 as shown in FIG. 4 where two waveforms A and B are shown as displacement distribution and a strain distribution of the plate, respectively. Vibration nodes and antinodes are alternately present at intervals of L/4. The primary electrodes 12a and 12b are rather referred to as drive electrodes in the vibrating element.

Returning to FIG. 1, the other half portion of the plate 11 is polarized in the lengthwise direction as shown by another arrow. When the piezoelectric-ceramic plate 11 vibrates, an AC voltage is resulted from the secondary electrode 13. Thus, when an AC voltage is applied to the primary electrodes 12a and 12b, a secondary output voltage is obtained from the secondary electrode 13. One of the primary electrodes 12a and 12b, for example, electrode 12b is used in common for the secondary side, that is, the secondary output is obtained across the primary electrode 12b and secondary electrode 13.

In order to apply the primary voltage to the primary electrodes 12a and 12b, input lead wires 53a and 52b are connected to the primary electrodes 12a and 12b at a vibration node, respectively, by soldering method. On the other hand, an output lead wire 53 is also connected to the secondary electrode 13 by soldering method.

Figure 2:
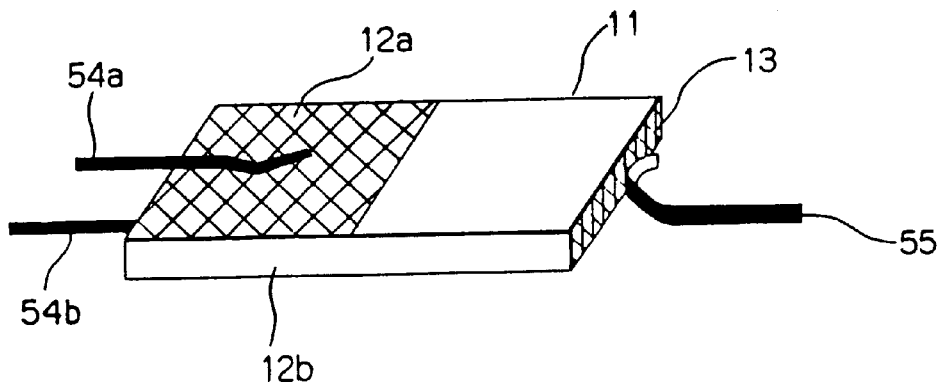
FIG. 2 is a perspective view of another example of a known piezoelectric transformer.
Figure 3:
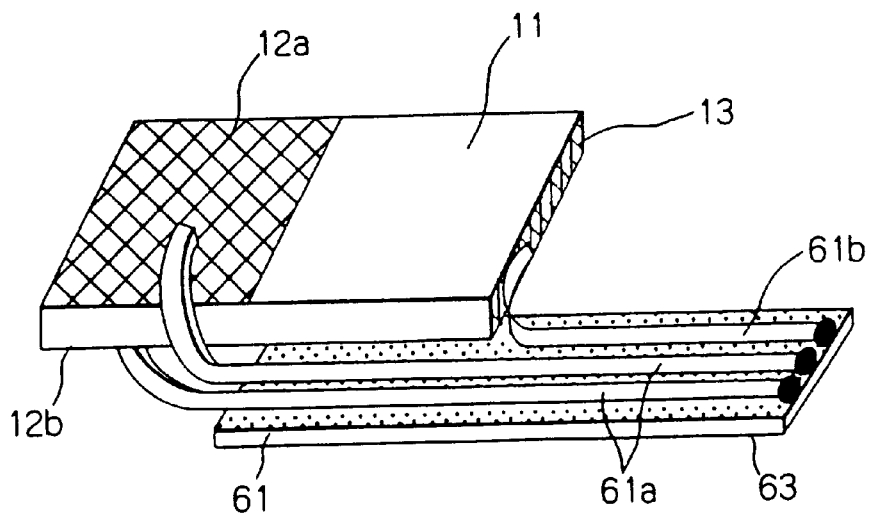
FIG. 3 is a perspective view of another example of a known piezoelectric transformer.

There are also known other structures for connecting input leads and output lead to the primary electrodes 12a and 12b and the secondary electrode 13, respectively, as shown in FIGS. 2 and 3.

Referring to FIG. 2, elastic conductor ribbons 54a and 54b and 55 are used in place of wires and are connected to the primary electrodes 12a and 12b and secondary electrode 13 by soldering method or pressure welding method.

Referring to FIG. 3, a flexible flat cable 61 is used in place of the lead wires and elastic conductor ribbons. The flexible flat cable 61 comprises conductor strips 61a and 61b deposited or formed on a flexible plastic sheet 63. End portions of conductor strips 61a and 61b are led out from the flexible plastic sheet 61 and are connected to the primary electrodes 12a and 12b and secondary electrode 13 by soldering method or pressure welding.

The piezoelectric transformer is formed small in size, especially, in thickness. Therefore, it is useful in an electronic circuit device which is integrated in a small size. However, the known structures are complex in connection of electrodes with leads and have disadvantages as described in the preamble.

Now, best mode for carrying out the present invention will be described with reference to embodiments shown in FIGS. 5 through 26.

Figure 5:
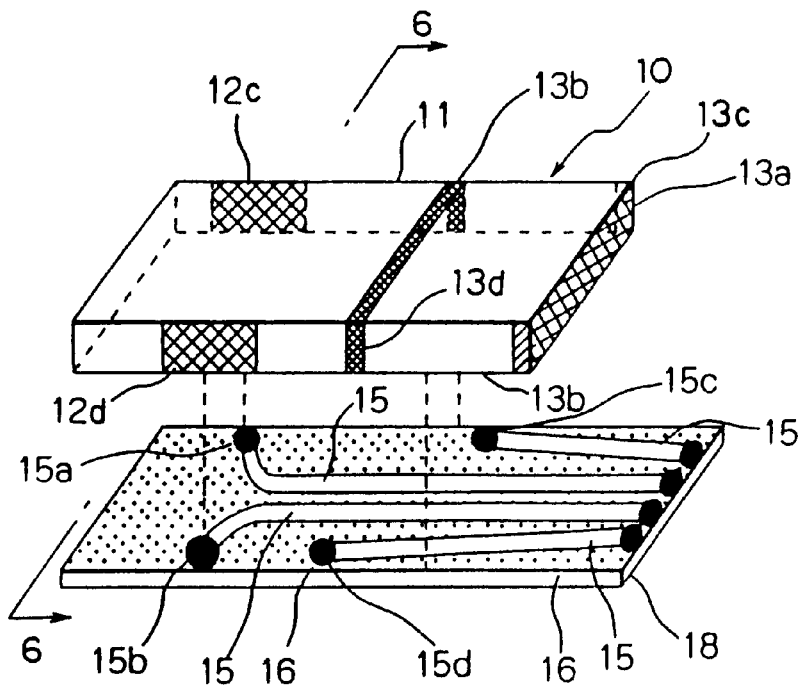
FIG. 5 is an exploded view of a piezoelectric transformer according to one embodiment of the present invention.
Figure 6:
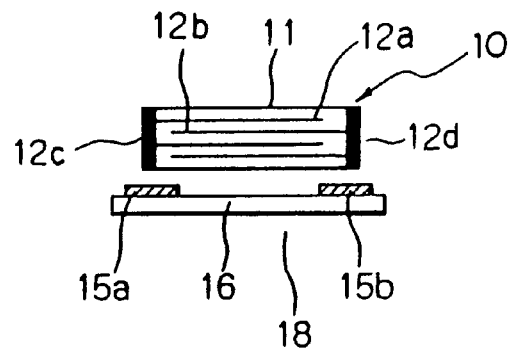
FIG. 6 is a sectional view taken along a line 6—6 in FIG. 5.

Referring to FIGS. 5 and 6, there is shown a piezoelectric transformer according to an embodiment of the present invention which comprises a transformer element 10 and a connection lead structure 18. The transformer element 10 has a structure which is similar to one as shown in FIG. 1 but has several differences. The similar portions are represented by the same reference symbols as in FIG. 1. With respect to the differences, a plurality of pairs of primary electrodes 12a and 12b are formed in the half portion of the piezoelectric-ceramic plate 11 as shown in FIG. 6. A pair of input terminal electrodes 12c and 12d are formed on opposite side surfaces of the half portion of the plate 11. One 12c of the input terminal electrodes are connected to the one electrodes 12a of paired primary electrodes, while the other 12d of the input terminal electrodes is connected to the other ones 12b of the paired primary electrodes. Further, an additional secondary electrode 13b is formed on the surface at the middle portion of the plate 11 in addition to the secondary electrode 13a formed on the end surface of the plate 11. This means that the output voltage can be obtained across the secondary electrodes 13a and 13b without one of the primary electrodes being used in common for the secondary side. The secondary electrodes 13a and 13b extend onto the side surfaces of the plate to form small side electrodes as output terminal electrodes 13c and 13d.

The transformer element 10 is provided with the connection lead structure 18 which comprises a plurality of conductor strips 15 insulated by and covered with a flexible plastic sheet 16. The conductor strips 15 has connection pads 15a–15d exposed out of the plastic sheet for electrical and mechanical connection with the input and output terminal electrodes 12c and 12d and 13c and 13d, respectively, by soldering method, when the transformer element is mounted on the connection lead structure 18. The connection lead structure 18 can be formed in a manner similar to a so-called flexible printed circuit (FPC) or a so-called flexible flat cable (FFC).

The connection lead structure 18 is also provided with terminal pads (as shown at black circles at right end of the structure 18 in the figure) of conductor strips 15 which can be easily connected with an external circuit.

In use of the transformer with the connection lead structure, operation for mounting on a circuit board and connecting thereto or other circuit elements is readily carried out without troublesome of treatment of lead wires.

In an example, a transformer was formed by forming a plurality of rectangular green sheets of piezoelectric ceramic, printing primary electrode patterns of Ad/Pd on the green sheets, stacking and sintering the green sheets to form a hard rectangular ceramic plate 11 with the primary electrodes 12a and 12b. Thereafter, the input terminal electrodes 12c and 12d, the secondary electrodes 13a and 13b with output terminal electrodes 13c and 13d are formed on the plate 11 by firing Ag paste. Then, an FPC was connected to the transformer as the connection lead structure 18 to form a sample of transformer with the connection lead structure. An input voltage of 20V was applied to the sample transformer through the FPC 18, and the output voltage and current and the temperature of the sample transformer were measured. The measured data are demonstrated in Table 1 together with the data measured relating to a transformer with lead wires shown in FIG. 1.

TABLE 1

|  | Lead Wire | FPC |
| --- | --- | --- |
| Output Voltage (V) | 1380 | 1367 |
| Output Current (mA) | 5 | 5 |
| Temperature (° C.) | 31 | 33 |

It is noted from Table 1 that the sample transformer with FPC according to the embodiment has properties similar to the known transformer of the lead wire type.

Further, the sample transformer was subjected to an aging test by use of the same input voltage. The output voltage and current and the temperature of the sample transformer were measured at start, after 500 hours, and 1,000 hours. The measured date are shown in Table 2.

TABLE 2

| Aging Time (Hr) | 0 | 500 | 1000 |
| --- | --- | --- | --- |
| Output Voltage (V) | 1367 | 1372 | 1350 |
| Output Current (mA) | 5 | 5.1 | 5.0 |
| Temperature (° C.) | 33 | 34 | 32 |

It is confirmed from Table 2 that the sample transformer of the present invention does not degrade in its performances after use of 1000 hours and that the transformer with the FPC is therefore useful in actual application.

Figure 7:
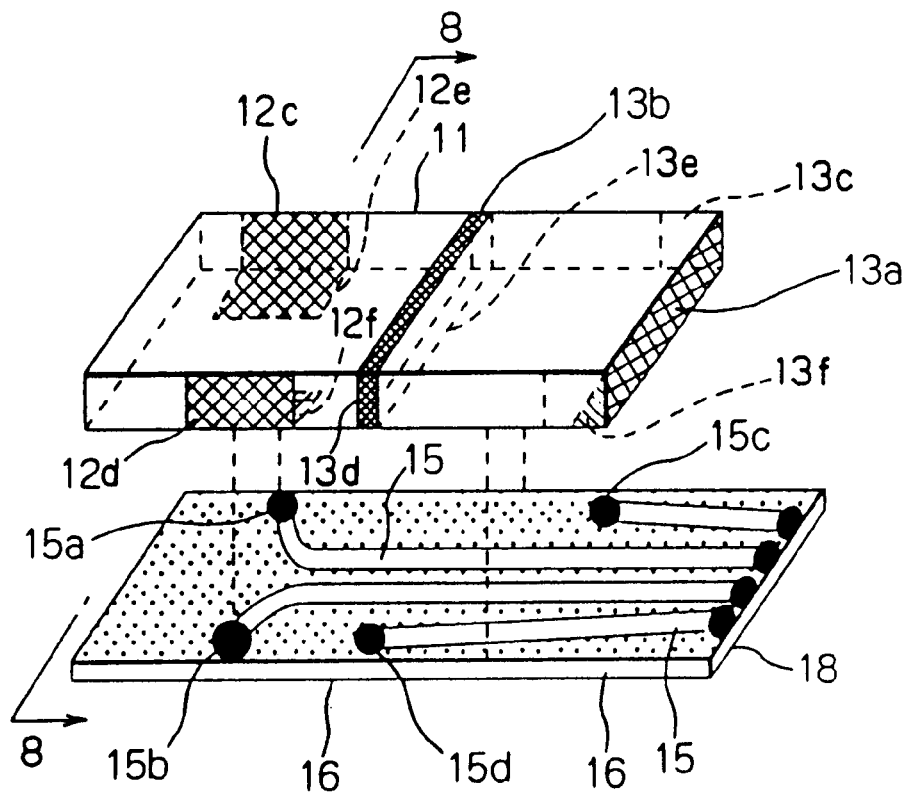
FIG. 7 is an exploded view of a piezoelectric transformer according to another embodiment of the present invention.
Figure 8:
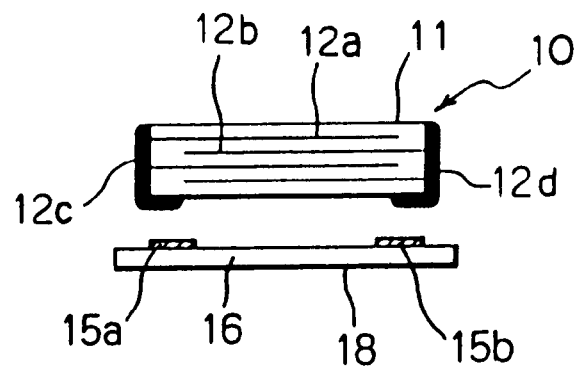
FIG. 8 is a sectional view taken along a line 8—8 in FIG. 7.

Referring to FIGS. 7 and 8, the transformer is similar to one of FIGS. 5 and 6 except a modification where input terminal electrodes 12c and 12d and output terminal electrodes 13c and 13d are extended from the side surfaces to the bottom surface (as viewed in the figure) of the plate 11 to form extended portions 12e, 12f, 13e, and 13f, respectively, on the bottom surface. As a result, the terminal electrodes can readily and reliably be connected to the pads 15a–15d on the connection lead structure 18 such as the FPC, as exemplarily shown relating to input terminals 12c–12e and 12d–12f and pads 15a and 15b in FIG. 6.

The extended portions 13e and 13f of output terminal electrodes 13d and 13c can be formed to laterally extend on the bottom surface over the width of the plate 11 as shown by dotted lines in FIG. 7.

Figure 9:
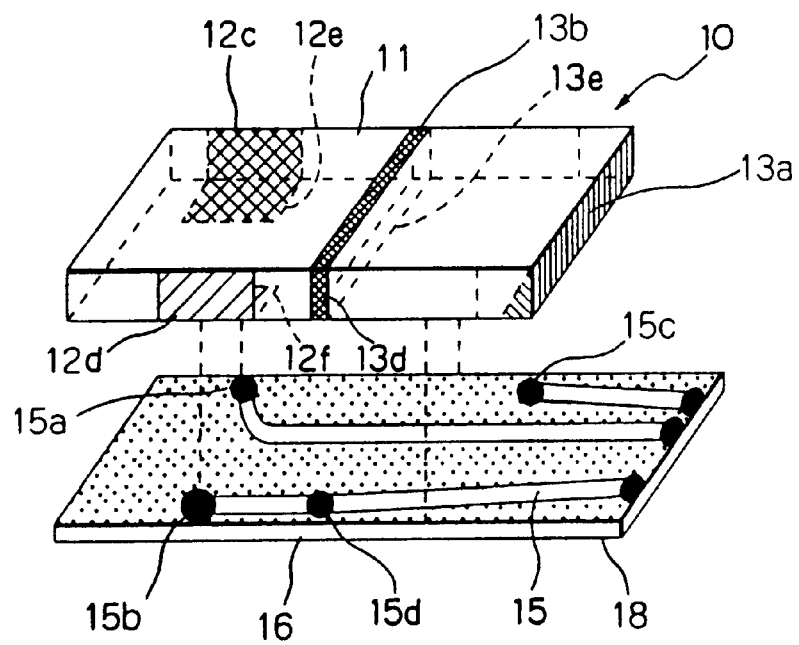
FIG. 9 is an exploded view of a piezoelectric transformer according to another embodiment of the present invention.

Referring to FIG. 9, the transformer with the connection lead structure is similar to that in FIG. 6 but has a modification where one 12d–12f of the input terminal electrodes and one 13d–13e of output terminal electrodes are connected to a common conductive strip 15 on the connection lead structure 18. Therefore, the common conductor strip has two pads exposed out of the plastic sheet 16. In this embodiment, one of the primary electrodes 12a and 12b and the secondary electrodes 13a and 13b are connected to an equal electric potential or grounded.

Figure 10:
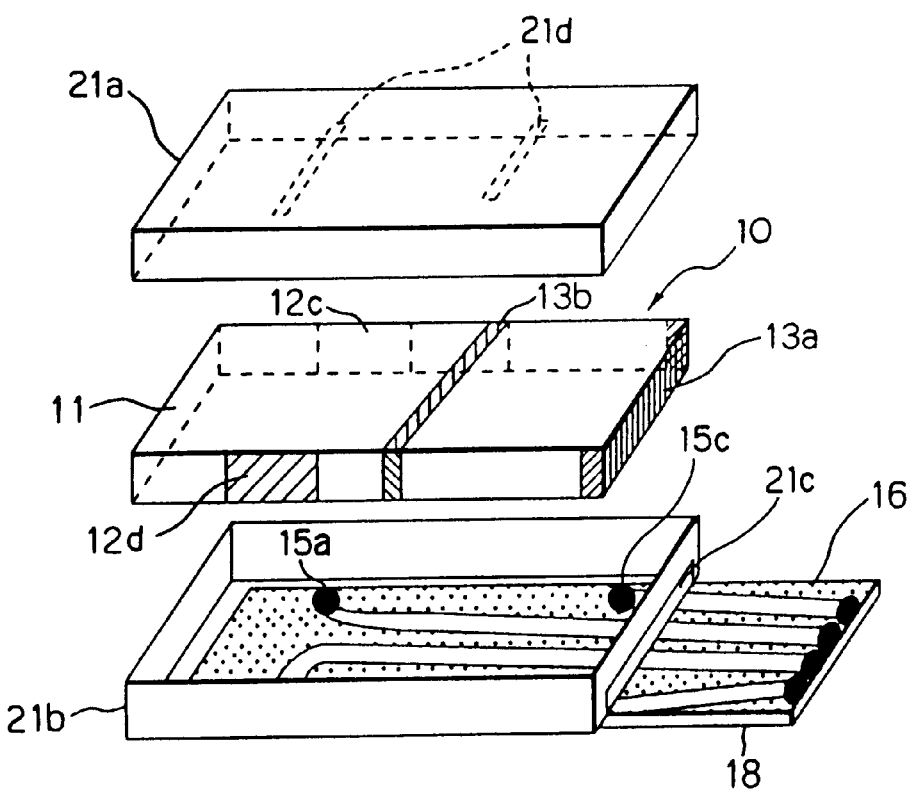
FIG. 10 is an exploded view of a piezoelectric transformer according to another embodiment of the present invention.

Referring to FIG. 10, an insulating envelope or case is provided to the transformer with the connection lead structure of FIGS. 5 and 6. The case is made of, for example, polycarbonate resin, and comprises an upper cover case 21a and a base case 21b with an open top. The base case 21b is formed with a side slit 21c in one end wall. Through the side slit 21c, the connection lead structure 18 is partially inserted in the base case 21b so as to the pads 15a–15d are in the base case 21c. The transformer element 10 is inserted into the base case 21b through the open end and the input and output terminal electrodes 12c, 12d, 13d and 13c are electrically and mechanically connected to the pads 15a–15d on the connection lead structure 18 by the soldering method, as described in connection with FIGS. 5 and 6. The upper cover case 21a is covered on the transformer element 10 and coupled to the base case 21b. Thus, the transformer element 10 and connection potions of the element 10 with connection lead structure 18 are insulated. The upper cover case 21a is provided with rims or projections 21d on its inner surface which come into press contact with the transformer elements 10 at its vibration nodes to stationary hold the transformer element 10 in the case 21a–21b.

Figure 11:
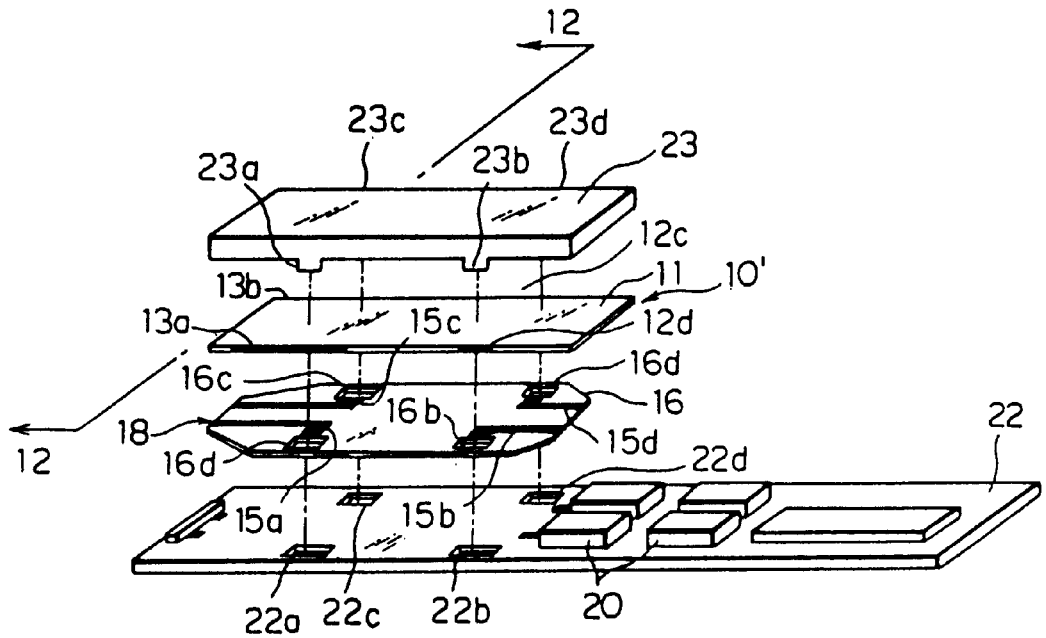
FIG. 11 is an exploded view of a piezoelectric transformer according to another embodiment of the present invention.
Figure 12:
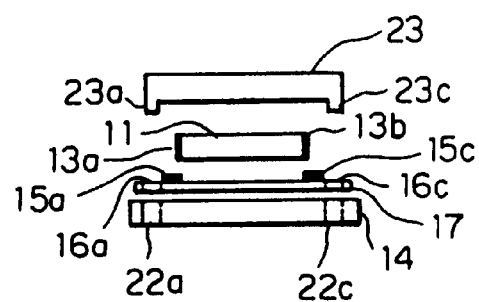
FIG. 12 is a sectional view taken along a line 12—12 in FIG. 11.

Referring to FIGS. 11 and 12, there is shown a piezoelectric transformer device with a connection lead structure according to another embodiment of the present invention. The embodiment is similar to the embodiment shown in FIG. 10 except several differences. The similar parts are shown by the same reference symbols and description thereto are omitted.

In the embodiment, the transformer element 10' is different from the element 10 in FIG. 10 in that the secondary electrodes 13a and 13b are formed on opposite side surfaces of the rectangular plate 11. The transformer is based on the so called $K_{31}$ vibration mode. The secondary electrodes 13a and 13b extend to the bottom edges (in the figure) of the side surfaces and are exposed in the plane of the bottom surface of the rectangular plate 11 to form the output terminal electrode portions, which are mechanically and electrically connected to the connection portions or pads 15a–15d of the conductor strips 15 of the FPC 18.

An upper cover case 23 is resin-molded with four projections 23a–23d projecting downwardly to be coupled to the FPC 18 and a circuit board 22 as a base element.

The FPC 18 has four through-holes 16a–16d in the vicinity of the pads 15a–15d through which the coupling projections 23a–23d pass.

The circuit board 22 also has four coupling holes 22a–22d to which the corresponding coupling projections 23a–23d are fitted and fixed. Thus, the cover case 23 and the circuit board 22 form an envelope of the transformer element 10 and FPC 18. It is preferable to use any adhering agent to fix the coupling projections to the circuit board at the coupling holes.

The circuit board 22 has a wiring pattern to which the conductor strips 15 are connected. Thus, the transformer is readily mounted on and connected to the circuit board 22.

In the shown embodiment, the circuit board has circuit elements 20 thereon to form a circuit device such as an inverter power supply including the transformer.

A sample of transformer of this embodiment was produced with a size of 40×6×1.5(mm) of the plate 11 and five pairs of internal primary electrodes in the similar manner as the embodiment is FIG. 5. The sample was subjected to similar tests for measuring performances. The measured data are shown in Table 3 and Table 4.

TABLE 3

|  | Lead Wire | FPC |
| --- | --- | --- |
| Output Voltage (V) | 1410 | 1407 |
| Output Current (mA) | 6 | 6 |
| Temperature (° C.) | 33 | 33 |

TABLE 4

| Aging Time (Hr) | 0 | 500 | 1000 |
| --- | --- | --- | --- |
| Output Voltage (V) | 1409 | 1420 | 1415 |
| Output Current (mA) | 6 | 6.1 | 6.1 |
| Temperature (° C.) | 33 | 34 | 34 |

The transformer of this embodiment can also maintain its performance for a long time without degradation.

Figure 13:
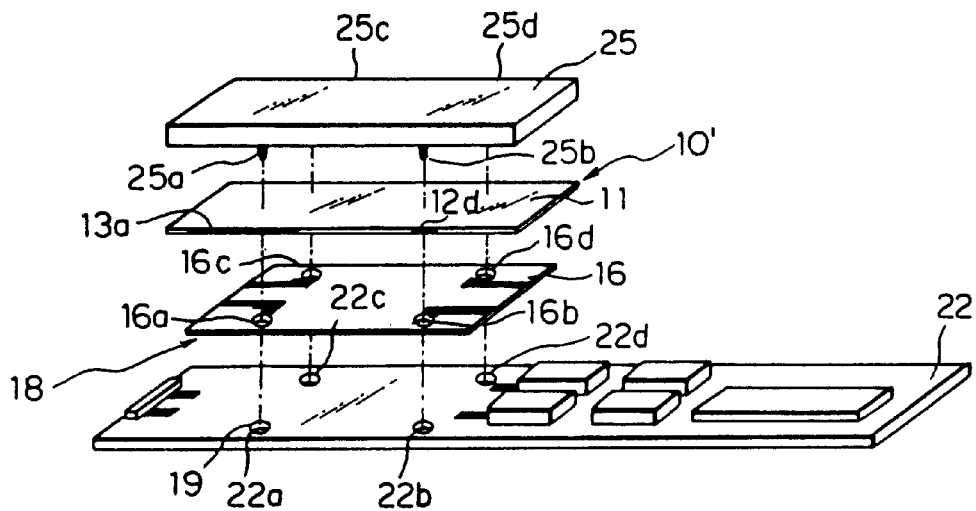
FIGS. 13 through 15 are exploded views of piezoelectric transformers according to different embodiments of the present invention.

Referring to FIG. 13, the transformer of the another embodiment shown therein is similar to that shown in FIGS. 11 and 12. An upper cover case 25 is resin molded and four metallic pins 25a–25c are fixed to the cover case 25 to form the coupling projections.

The through-holes 16a–16d are formed through the connection pads of the FPC 18 so that the metallic land portions 19 remain around the through-holes. The metallic pins 25a–25d are electrically connected to the conductor strips of the FPC 18 through the land portions 19. Thus, the metallic coupling projections 25a–25d can be fixed to the FPC by the soldering method.

The metallic pins 25a–25d may be formed at positions to enable to come into contact with the input and output terminal electrodes 12c, 12d, 13a and 13b, respectively. In the case, connection of the conductor strips 15 with the input and output terminal electrodes 12c, 12d, 13a and 13b is enhanced by the metallic pins 25a–25d.

Figure 14:
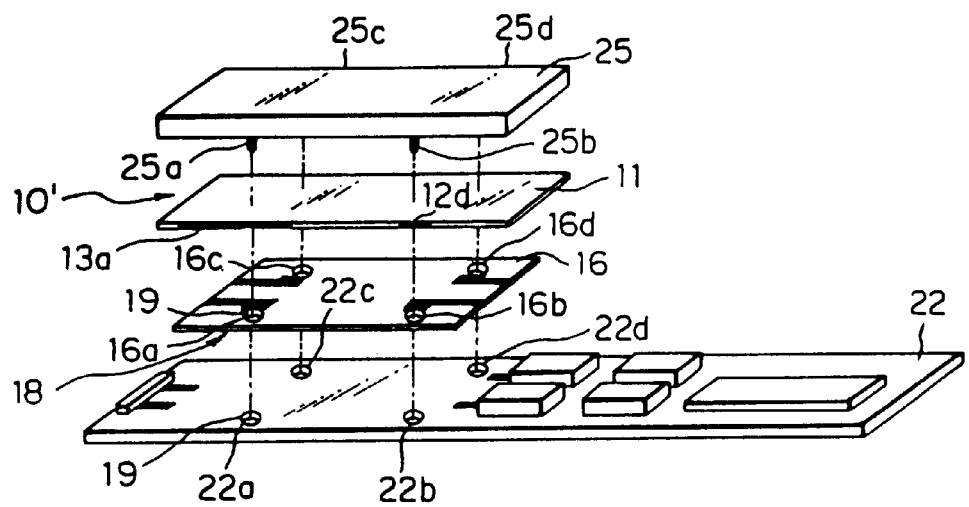

The embodiment of FIG. 14 is also similar to that shown in FIG. 13. In the embodiment, the circuit board 22 is also provided with metallic land portions 19 around the coupling holes 22a–22d. Thus, the coupling projections 25a–25d can also fixed to the land portions by the soldering method.

Figure 15:
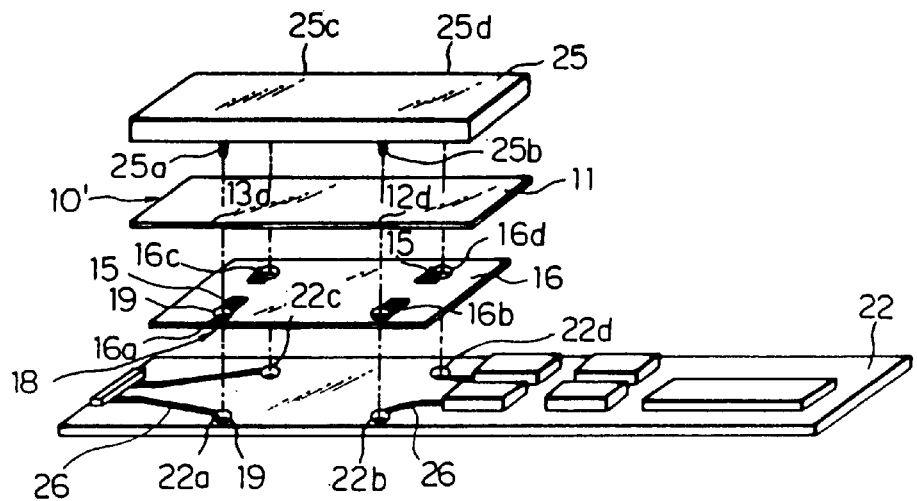

The embodiment of FIG. 15 is a modification of that of FIG. 14. The wiring pattern 26 on the circuit board 22 is formed to continue to the land portions 19 thereon. Therefore, the connection pads on the FPC 18 can be connected to the wiring pattern on the circuit board 22 through the metallic coupling pins 25a–25d. Therefore, the conductors 15 of the FPC 18 are unnecessary to be extended to its edge.

Figure 17:
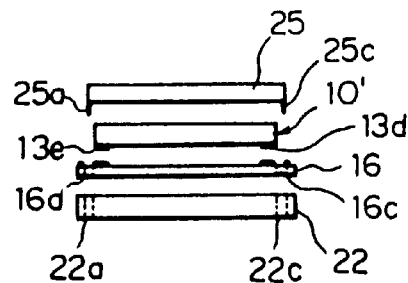
FIG. 17 is a sectional view taken along a line 17—17 in FIG. 16.
Figure 16:
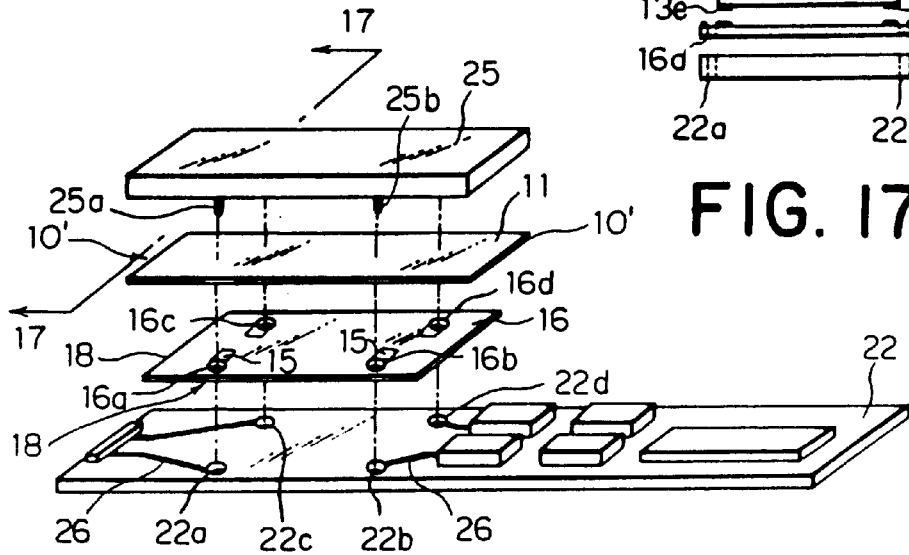
FIG. 16 is an exploded view of a piezoelectric transformer according to another embodiment of the present invention.

Another embodiment shown in FIGS. 16 and 17 is also a modification of that of FIG. 15. In the modification, the input and the output terminal electrodes 13d and 13e are provided on the bottom surface of the rectangular plate 11. This enhances the connection of the input and output terminals with the connection pads like the embodiment shown in FIGS. 7 and 8.

Figure 18:
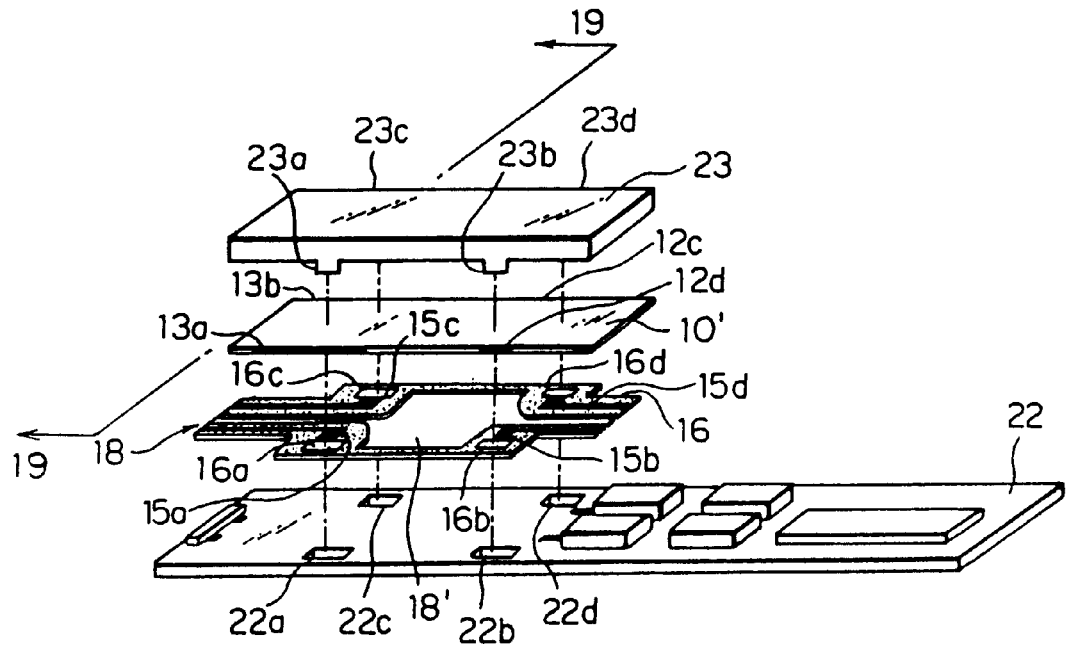
FIG. 18 is an exploded view of a piezoelectric transformer according to another embodiment of the present invention.
Figure 19:
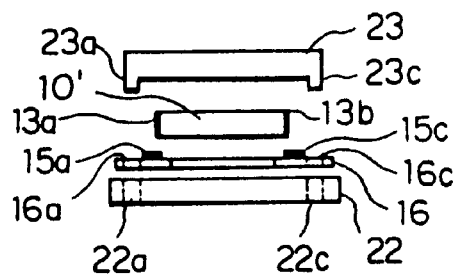
FIG. 19 is a sectional view taken along a line 19—19 in FIG. 18.

Referring to FIGS. 18 and 19, the embodiment shown therein is similar to that of FIGS. 11 and 12. The FPC 18 has an opening 18' in the region other than regions corresponding to the vibration nodes and insulating said conductor strips 15. This enhances heat dissipation.

A sample of transformer of this embodiment was produced with a size of 40×6×1.5(mm) of the plate 11 and five pairs of internal primary electrodes in the similar manner as the embodiment in FIG. 5. The sample was subjected to similar tests for measuring performances. The measured data are shown in Table 5 and Table 6.

TABLE 5

|  | Lead Wire | FPC |
| --- | --- | --- |
| Output Voltage (V) | 1410 | 1410 |
| Output Current (mA) | 6 | 6 |
| Temperature (° C.) | 33 | 33 |

TABLE 6

| Aging Time (Hr) | 0 | 500 | 1000 |
| --- | --- | --- | --- |
| Output Voltage (V) | 1401 | 1404 | 1398 |
| Output Current (mA) | 6 | 6.1 | 6.0 |
| Temperature (° C.) | 33 | 34 | 33 |

It will be understood that the heat dissipation is improved comparing with the embodiment of FIGS. 11 and 12.

Referring to FIGS. 20 and 21, a modification of the embodiment of FIGS. 18 and 19 is shown. The FPC 18 has an enlarged opening 18' in comparison with that in FIGS. 18 and 19. The conductor strips 15 are formed in zigzag forms and openings are further formed adjacent conductor strips as shown in the figure.

The embodiment of FIGS. 22 and 23 is a modification of FIG. 15. The FPC 18 is also provided with an opening 18' in the similar manner as in the embodiment of FIGS. 20 and 21.

In the embodiment, the transformer element 10 is similar to that in the embodiment of FIGS. 5 and 6.

Figure 24:
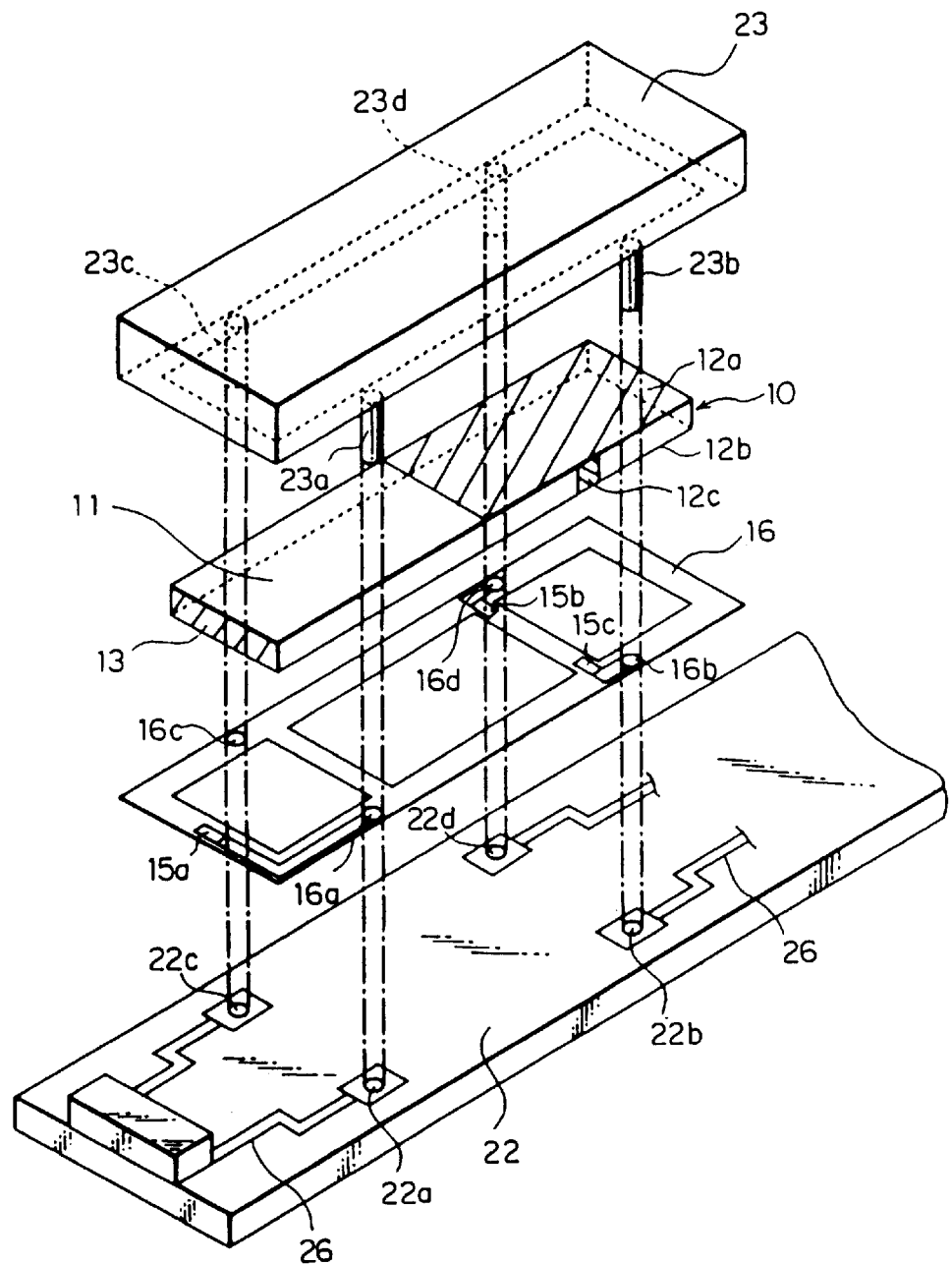
FIGS. 24–26 are exploded views of piezoelectric transformers according to different embodiments of the present invention.

Referring to FIG. 24, the embodiment shown therein is a modification of the embodiment of FIGS. 20 and 21. The through-holes 16a–16d of the FPC and the coupling holes 22a–22d are apart from the connection portions 15a–15c of the FPC 18 in a direction of a length of the rectangular plate 11, preferably more than 1/16 of the length of the rectangular plate 11. This results in that the cover case 23, FPC 18 and circuit board 22 are fixed together at positions apart from the connection points between the input and output terminals and the connection pads and near the vibration nodes. The conductor strips 15 and the wiring patterns 26 on the circuit board 22 are connected to each other through the through-holes.

Figure 25:
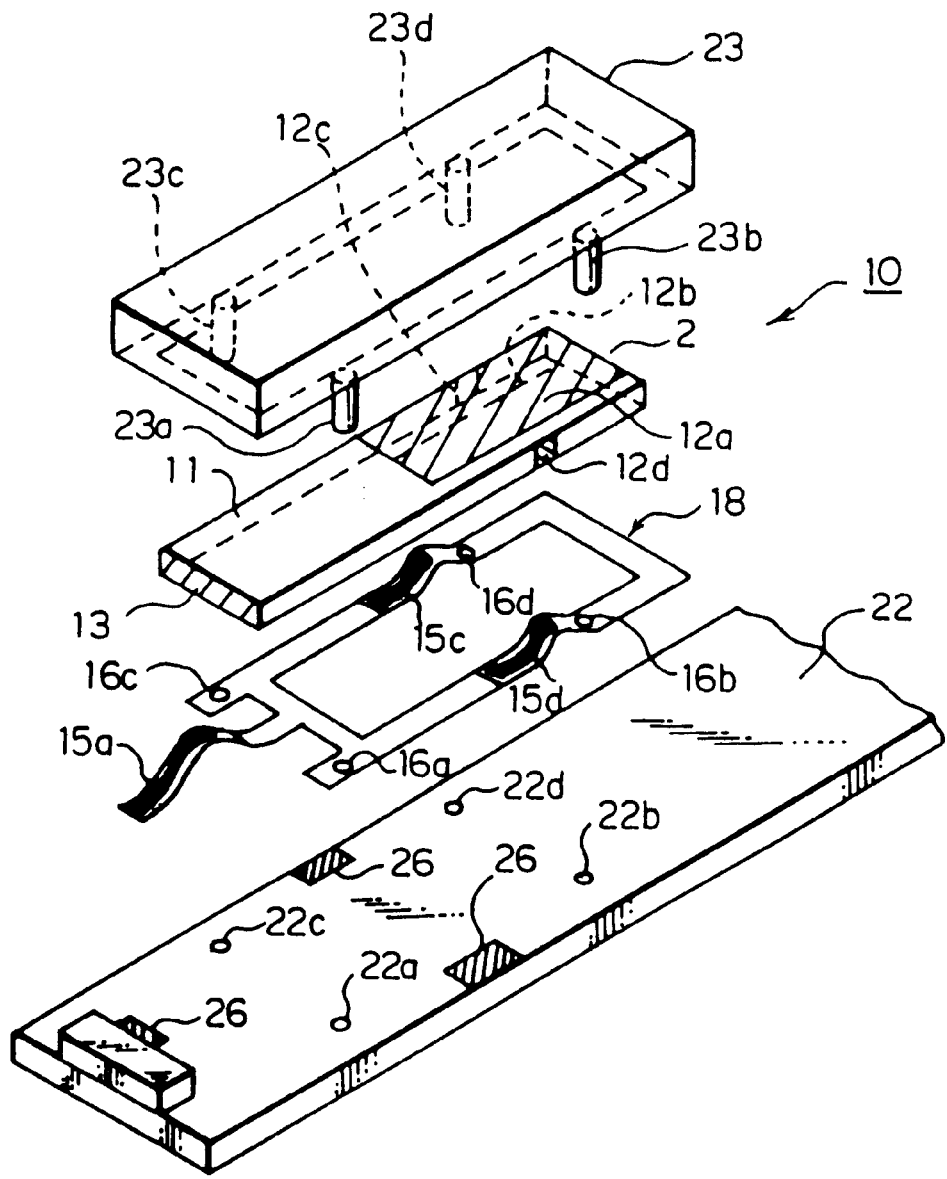
Figure 26:
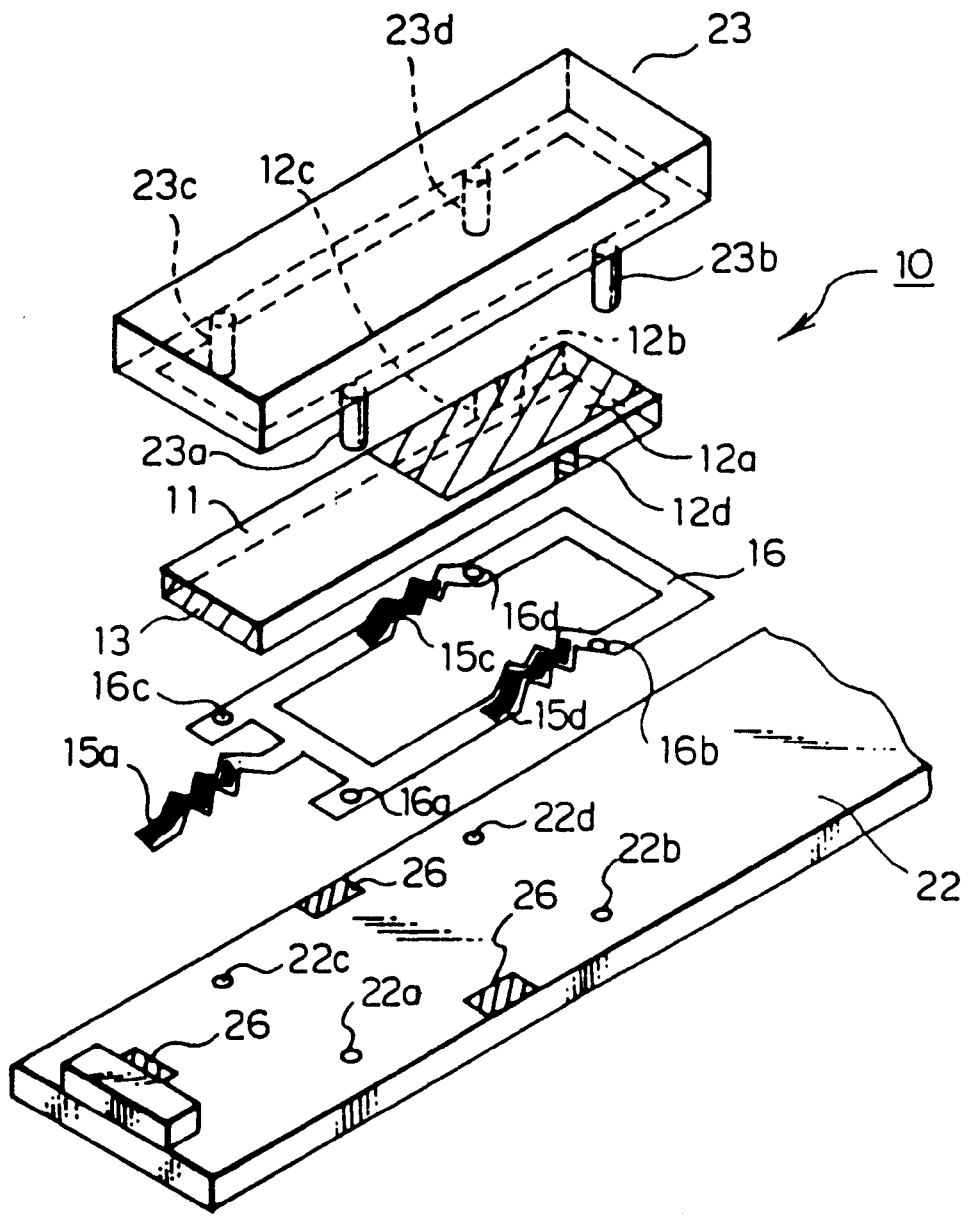

FIGS. 25 and 26 show different modification of FIG. 24. Referring to FIG. 25, the connection portions 15a, 15c and 15d are bent to project towards the rectangular plate 11 in an arcuate form. Thus, the connection portions are in press-contact with the input and output terminal electrodes. The connection therebetween is insured.

In FIG. 25, the transformer element 10 is shown to have a similar primary and secondary electrode structure similar to that in FIG. 1. However, the input terminal electrodes 12c and 12d are provided to connect with the primary electrodes 12a and 12b, respectively. The secondary electrode 13 provides the output terminal electrode portion at the lower end portion.

In FIG. 26, the connection portions 15a–15d are formed in waveforms to insure the connection between the input and output terminal electrodes 12c, 12d, and 13 and the connection portions 15a–15d.

INDUSTRIAL APPLICABILITY

According to the present invention, the small-sized piezoelectric transformer can be provided which is easy in various deal in assembling in an electric circuit device. Therefore, it can provide a small-sized electronic device with a reduced cost.

We claim:

1. A piezoelectric transformer comprising a transformer element and a connection lead structure coupled to said transformer element for connecting said transformer element with an external circuit, said transformer element comprising:

a rectangular plate made of a piezoelectric ceramic and having a first surface and side surfaces;

at least one pair of primary electrodes associated with said rectangular plate for receiving a driving voltage as a primary voltage to subject said rectangular plate to vibration by means of the piezoelectric effect;

input terminal electrodes formed on said rectangular plate partially exposed on said first surface and connected to pair of electrodes, respectively; and at least one secondary electrode formed at a region of said rectangular plate where a voltage potential is generated by the vibration of said rectangular plate due to the piezoelectric effect, said secondary electrode having an output terminal electrode portion extending to and exposed on said first surface of said rectangular plate, and said connection lead structure comprising:

a flexible flat sheet of insulator material; and a plurality of conductor strips formed in said flat sheet and having connection portions partially exposed out of the flat sheet, said input and output terminal electrodes being mechanically and electrically connected to a corresponding one of said connection portions so that said transformer element stands on said flat sheet with the first surface of said rectangular plate overlying said flat sheet, said piezoelectric transformer also including an insulator envelope in which said piezoelectric transformer is confined together with said lead connection structure with a part of said lead structure extending out of said envelope for connection with said external circuit, said envelope comprising a base element with a cover coupled thereto;

the vibration of said rectangular plate being characterized by vibration nodes, wherein said cover element has projections on an inner surface thereof, said projections being pressed onto the rectangular plate at positions corresponding to the vibration nodes to hold said transformer element stationary in said envelope.

2. A piezoelectric transformer as claimed in claim 1, wherein said cover element has a plurality of coupling projections extending to wherein said base element, said flexible flat sheet has a plurality of through-holes receiving said coupling projections, and said base element has coupling holes receiving and fixedly coupled to said coupling projections, respectively.

3. A piezoelectric transformer as claimed in claim 2, wherein said coupling projections are of insulator material and wherein, said through-holes and said coupling holes are apart from said connection portions of said conductor strips in a direction of a length of said rectangular plate.

4. A piezoelectric transformer as claimed in claim 3, wherein said through holes and said coupling holes are apart from said connection portions of said conductor strips by a distance of more than $1/16$ of a length of said rectangular plate.

5. A piezoelectric transformer as claimed in claim 3, wherein said base element is an electrical circuit board having a wiring pattern to which said conductor strips are connected through said through-holes.

6. A piezoelectric transformer as claimed in claim 2, wherein said coupling projections are of metal.

7. A piezoelectric transformer as claimed in claim 6, wherein said through-holes are formed through said connection portions and said input and output terminal electrodes extend on said side surfaces of said rectangular plate and are in contact with said coupling projections.

8. A piezoelectric transformer as claimed in claim 6, wherein said base element is an electrical circuit board having a wiring pattern to which said conductor strips are connected.

9. A piezoelectric transformer as claimed in claim 8, wherein said electrical circuit board has conductive land portions in which said coupling holes are formed.

10. A piezoelectric transformer as claimed in claim 8, wherein said coupling holes are formed in said wiring pattern to thereby connect said conductor strips with said wiring pattern through said coupling projection.

11. A piezoelectric transformer as claimed in any one of claims 3 through 10, the vibration wherein of said rectangular plate is characterized by vibration nodes, wherein said flat sheet has at least one opening in the region other than regions corresponding to said vibration nodes and wherein said conductor strips are insulated.

12. A piezoelectric transformer as claimed in claim 11, wherein said connection portions project towards said rectangular plate to be in press contact with said input and output terminal electrodes.

13. A piezoelectric transformer as claimed in claim 12, wherein each of said connection portions is bent in an arcuate form together with said flat sheet.

14. A piezoelectric transformer as claimed in claim 12, wherein each of said connection portions is bent in a wave form together with said flat sheet.

* * * * *

UNITED STATES PATENT AND TRADEMARK OFFICE
CERTIFICATE OF CORRECTION

PATENT NO.   : 5,998,909
DATED        : December 7, 1999
INVENTOR(S)  : Kasunori Kumasaka et al.

It is certified that error appears in the above-indentified patent and that said Letters Patent is hereby corrected as shown below:

Claim 2, line 3, the term "wherein" was misplaced and should appear before "said" at end of line.

Claim 11, line 2, the term "wherein" after "vibration" was misplaced and should appear before "the vibration."

Signed and Sealed this

First Day of August, 2000

*Attest:*

Q. TODD DICKINSON

*Attesting Officer*  *Director of Patents and Trademarks*